(12) United States Patent
Hellberg

(10) Patent No.: US 8,836,421 B2
(45) Date of Patent: Sep. 16, 2014

(54) APPARATUS AND METHOD FOR USE WITH AN AMPLIFIER CIRCUIT

(75) Inventor: Richard Hellberg, Huddinge (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 150 days.

(21) Appl. No.: 13/643,200

(22) PCT Filed: May 31, 2012

(86) PCT No.: PCT/EP2012/060322
§ 371 (c)(1),
(2), (4) Date: Oct. 24, 2012

(87) PCT Pub. No.: WO2013/087232
PCT Pub. Date: Jun. 20, 2013

(65) Prior Publication Data
US 2013/0321084 A1 Dec. 5, 2013

Related U.S. Application Data

(60) Provisional application No. 61/576,065, filed on Dec. 15, 2011.

(51) Int. Cl.
*H03F 3/68* (2006.01)
(52) U.S. Cl.
USPC .......................... 330/124 R; 330/295; 330/53
(58) Field of Classification Search
USPC ........................................ 330/124 R, 295, 53
IPC .......................................................... H03F 3/68
See application file for complete search history.

(56) References Cited

U.S. PATENT DOCUMENTS

| | | | |
|---|---|---|---|
| 6,836,183 B2 * | 12/2004 | Wight | 330/124 R |
| 6,940,349 B2 | 9/2005 | Hellberg | |
| 7,279,971 B2 | 10/2007 | Hellberg et al. | |
| 7,411,449 B2 | 8/2008 | Klingberg et al. | |
| 7,453,952 B2 * | 11/2008 | Saed et al. | 375/296 |
| 7,729,445 B2 * | 6/2010 | Ravi et al. | 375/297 |

(Continued)

FOREIGN PATENT DOCUMENTS

JP  2007-150905  6/2007

OTHER PUBLICATIONS

Doherty, W. H., "A New High-Efficiency Power Amplifier for Modulated Waves," Proc. IRE, vol. 24, No. 9, pp. 1163-1182, Sep. 1936.
Chireix, "High Power Outstanding Modulation", Proceedings of the Institute of Radio Engineers, vol. 23, No. 2, Nov. 1935, pp. 1370-1392.

(Continued)

*Primary Examiner* — Patricia Nguyen
(74) *Attorney, Agent, or Firm* — Nixon & Vanderhye, P.C.

(57) ABSTRACT

An output network for use with a multi-transistor amplifier circuit comprises N transistors configured to provide a Chireix outphasing behavior. The N transistors coupled to receive different amplitude and/or phase signals relative to a source signal. The output network comprises: a plurality of branches arranged in a hierarchical structure between N input nodes and an output node; at least one branch connection arranged between the input nodes and the output node, wherein each branch connection is arranged to couple first and second branches from an input side to a single branch on an output side. The hierarchical structure is arranged asymmetrically such that at least one branch connection comprises a different number of input nodes ultimately connected to its first branch compared to the number of input nodes ultimately connected to its second branch.

14 Claims, 11 Drawing Sheets

(56) References Cited

U.S. PATENT DOCUMENTS

| | | |
|---|---|---|
| 2006/0114060 A1 | 6/2006 | Hellberg |
| 2009/0112564 A1* | 4/2009 | Schmieder .................... 703/21 |
| 2009/0322421 A1 | 12/2009 | Mueller et al. |
| 2010/0117727 A1 | 5/2010 | Dawson et al. |
| 2012/0224653 A1* | 9/2012 | Lozhkin ....................... 375/297 |

OTHER PUBLICATIONS

International Search Report and Written Opinion issued in Application No. PCT/EP2012/060322 dated Aug. 21, 2012.

Perreault, D. J. "A New Power Combining and Outphasing Modulation System for High-Efficiency Power Amplification," IEEE Proc. MWSCAS 2010, pp. 441-444.

* cited by examiner

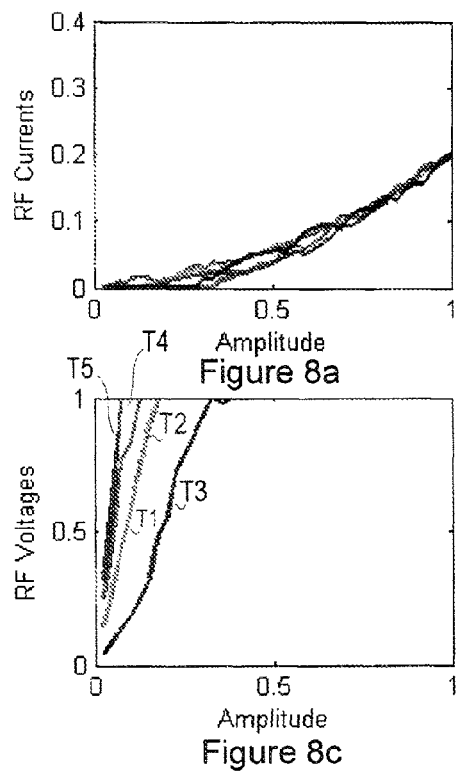
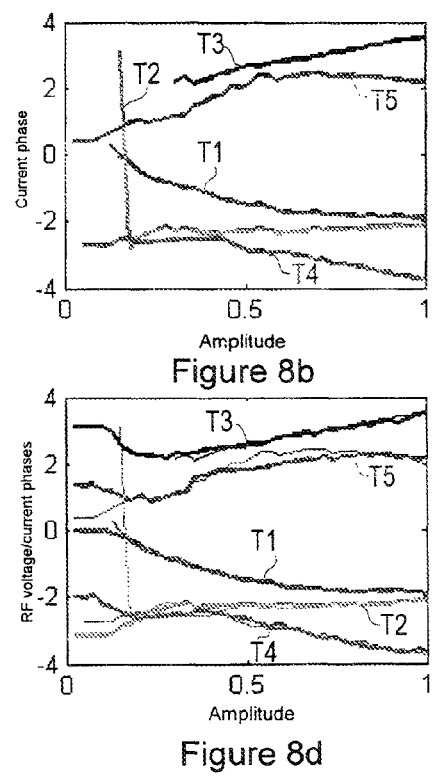
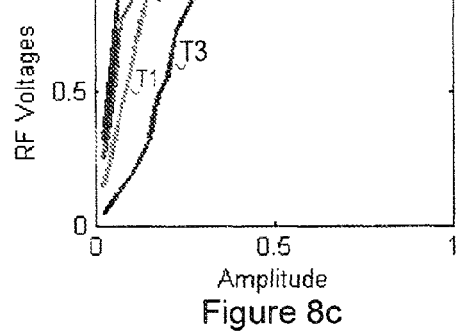
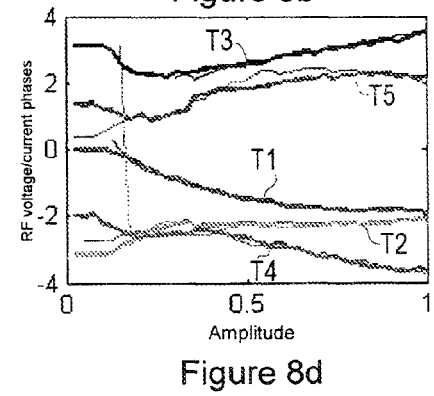
Figure 8a
Figure 8b
Figure 8c
Figure 8d
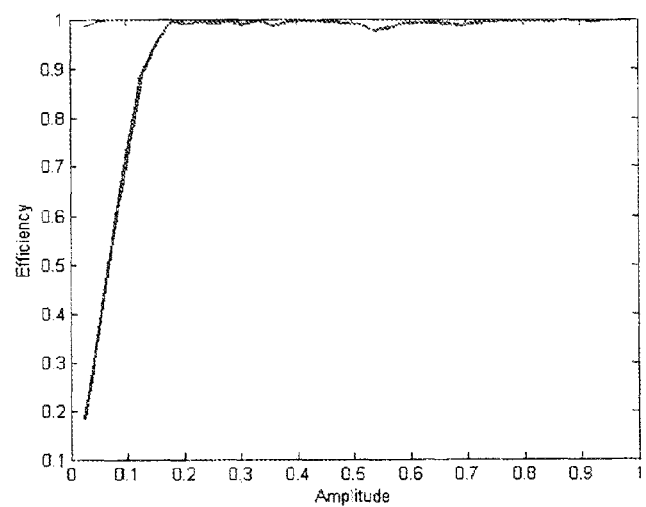
Figure 9

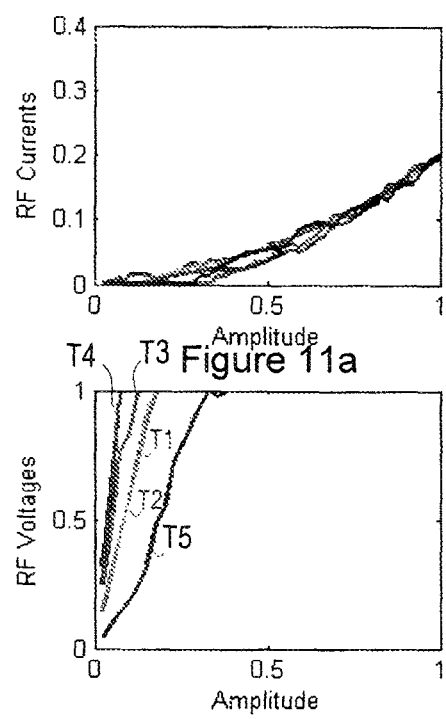
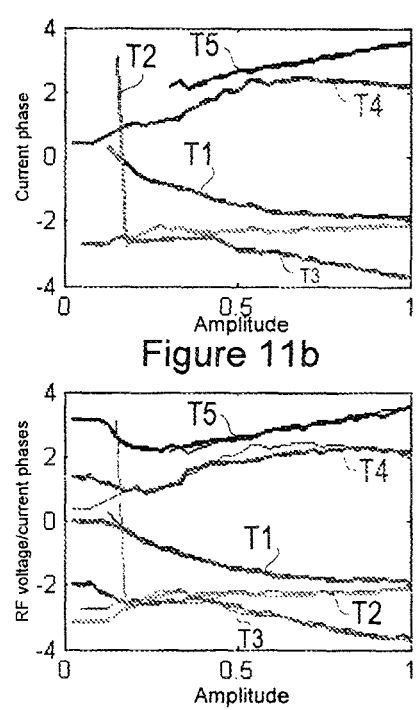
Figure 11a
Figure 11b
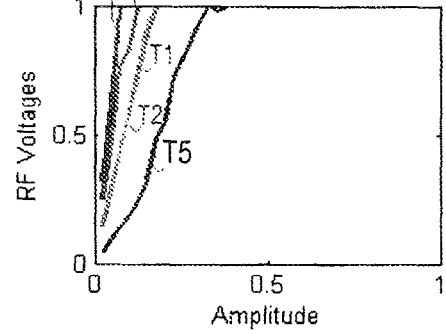
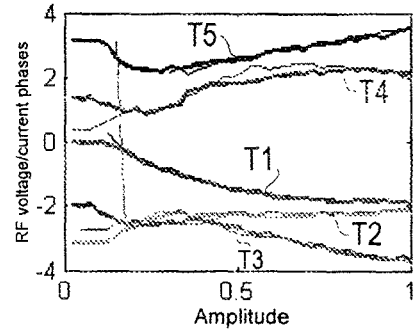
Figure 11c
Figure 11d

APPARATUS AND METHOD FOR USE WITH AN AMPLIFIER CIRCUIT

This application is the U.S. national phase of International Application No. PCT/EP2012/060322, filed 31 May 2012, which designated the U.S. and claims the benefit of U.S. Provisional Application No. 61/576,065, filed 15 Dec. 2011, the entire contents of each of which are hereby incorporated by reference.

TECHNICAL FIELD

The present invention relates to an apparatus and method for use with an amplifier circuit, and in particular to an output network for use with a multi-transistor amplifier circuit, such as a Chireix type amplifier.

BACKGROUND

In radio transmitters for broadcast, cellular and satellite systems, the power amplifier (PA) in the transmitter has to be very linear, in addition to being able to simultaneously amplify many radio channels (frequencies) or independent user data channels, spread across a fairly wide bandwidth. High linearity is required since nonlinear amplifiers would cause leakage of interfering signal energy between channels and distortion within each channel.

Two methods have been widely used in Radio Frequency (RF) applications for overcoming the low efficiency of conventional linear power amplifiers, namely the Chireix outphasing method and the Doherty method, further details of which can be found in "High Power Outphasing Modulation" by H Chireix, Proc. IRE, vol 23, no 2, pp 1370-1392, November 1935 and "A New High Efficiency Power Amplifier for Modulated Waves" by W. H. Doherty, Proc. IRE, vol. 24, no. 9, pp 1163-1182, September 1936. Chireix and Doherty amplifiers were the first examples of RF amplifiers based on multiple transistors with passive output network interaction and combination that gave high average efficiency for amplitude-modulated signals.

The outphasing technique in Chireix amplifiers involves combining several (generally two) phase-modulated constant-amplitude signals. These signals are produced in a "signal component separator" (SCS) and subsequently, after up-conversion and amplification through RF chains (comprising mixers, filters and amplifiers), combined to form an amplified linear signal in an output combiner network. The phases of these constant-amplitude signals are chosen so that the result from their vector summation yields the desired amplitude. An advantage of a Chireix amplifier is its ability to change an efficiency curve to suit different peak-to-average power ratios.

Amplifiers based on passive output network interaction structures have the advantage of needing only fundamental radio frequency (RF) network and signal modifications. Compared to single-transistor amplifiers they differ only in the number of independently driven transistors. Harmonics and/or baseband modifications, that are required for other high-efficiency amplifiers, are optional.

The field has been generalized for two-transistor structures, for example as disclosed in U.S. Pat. No. 6,940,349 by the present Applicant. Examples of expandable multi-transistor structures, and ways to drive them efficiently, are disclosed in U.S. Pat. Nos. 7,279,971 and 7,411,449 by the present Applicant. These structures are sufficient to provide all combinations of Doherty and Chireix efficiency curve features.

Recently, an alternative way to construct multi-transistor Chireix amplifiers with 4, 8, 16, (powers of two) number of differently driven transistors were proposed by Perreault et al, in a paper entitled "A New Power Combining and Outphasing Modulation System for High-Efficiency Power Amplification", IEEE Proc. MWSCAS 2010, pages 441-444. These amplifiers have the properties that all constituent transistors have equal size and operate very similarly. The amplifiers of this type operate in an "outphasing" mode, i.e. maximum voltage operation when only the phase difference between transistor output voltages vary, over a wide range of output amplitudes. In this range, the sum of the output RF current amplitudes varies almost parabolically with output amplitude. This wide range of outphasing is close to optimal for transistors and frequencies for which series losses dominate even at low output powers. The structure of these amplifiers is shown in FIGS. 1a and 1b.

FIG. 1a shows the structure of a "two-level" amplifier as proposed by Perreault et al., which comprises four sources $101_1$ to $101_4$ (for example transistors) and the output network arranged in two levels (Level 1 and Level 2).

FIG. 1b shows the structure of a "three-level" amplifier having eight sources $101_1$ to $101_8$ (for example transistors), with the output network arranged in three levels, Level 1, Level 2 and Level 3.

The reactances denoted +/−jX are capacitors and inductors. The same electrical behavior can also be obtained with different lengths of transmission line instead of reactances, as disclosed in U.S. Pat. Nos. 7,279,971 and 7,411,449.

In the paper by Perreault it is specifically stated that four or more transistors or sources are used, where "or more" means higher powers of two (that is 8, 16, 32, 64, etc.).

The extra complexity and power consumption for driving four transistors can, in many cases, be so high that it negates the efficiency benefit of the four-transistor amplifier itself.

Similar problems occur for the higher powers of two, whereby the extra efficiency benefit of an 8-transistor Chireix amplifier, for example, may be outweighed by the additional complexity.

The inventions described in U.S. Pat. Nos. 7,279,971 and 7,411,449 have the ability to form amplifiers with any number (larger than two) of differently driven transistors. However, for the specific situation for which the amplifiers in Perreault are the closest to optimal (transistors and frequencies for which series losses dominate even in very low output power ranges) these amplifiers are less close to optimal.

SUMMARY

It is an aim of the present invention to provide a method and apparatus which obviate or reduce at least one or more of the disadvantages mentioned above.

According to a first aspect of the present invention there is provided an output network for use with a multi-transistor amplifier circuit comprising N transistors configured to provide a Chireix outphasing behaviour, the N transistors coupled to receive different amplitude and/or phase signals relative to a source signal. The output network comprises a plurality of branches arranged in a hierarchical structure between N input nodes and an output node. At least one branch connection is arranged between the input nodes and the output node, wherein each branch connection is arranged to couple first and second branches from an input side to a single branch on an output side. The hierarchical structure is arranged asymmetrically such that at least one branch connection comprises a different number of input nodes ultimately connected to its first branch compared to the number of input nodes ultimately connected to its second branch.

The asymmetric structure has the advantage of enabling a more efficient output network to be provided, such that the output network can be used with an amplifier network comprising a number of transistors that do not equal the power of two, for example a three-transistor Chireix amplifier, a five-transistor Chireix amplifier, a six-transistor, seven-transistor, nine-transistor, ten-transistor Chireix amplifier, and so on.

According to another aspect of the present invention, there is provided a method as defined in the appended claims.

BRIEF DESCRIPTION OF THE DRAWINGS

For a better understanding of the present invention, and to show more clearly how it may be carried into effect, reference will now be made, by way of example only, to the following drawings in which:

FIG. 3a shows a plot of RF currents versus amplitude, relating to the embodiment of FIG. 2a;

FIG. 3b shows a plot of current phases relative to the phase of the output signal, relating to the embodiment of FIG. 2a;

FIG. 3c shows a plot of RF voltages versus amplitude, relating to the embodiment of FIG. 2a;

FIG. 3d shows a plot of RF voltage phases and RF current phases, relating to the embodiment of FIG. 2a;

FIG. 5 illustrates the efficiency of a three-transistor asymmetric hierarchic Chireix amplifier according to another embodiment based on FIG. 2a;

FIG. 6 illustrates the efficiency of a three-transistor asymmetric hierarchic Chireix amplifier according to another embodiment based on FIG. 2a;

FIG. 8a shows a plot of RF currents versus amplitude, relating to the embodiment of FIG. 7;

FIG. 8b shows a plot of current phases relative to the phase of the output signal, relating to the embodiment of FIG. 7;

FIG. 8c shows a plot of RF voltages versus amplitude, relating to the embodiment of FIG. 7;

FIG. 8d shows a plot of RF voltage phases and RF current phases, relating to the embodiment of FIG. 7;

FIG. 9 illustrates the efficiency of a five-transistor asymmetric hierarchic Chireix amplifier according to one embodiment based on FIG. 7;

FIG. 11a shows a plot of RF currents versus amplitude, relating to the embodiment of FIG. 10;

FIG. 11b shows a plot of current phases relative to the phase of the output signal, relating to the embodiment of FIG. 10;

FIG. 11c shows a plot of RF voltages versus amplitude, relating to the embodiment of FIG. 10;

FIG. 11d shows a plot of RF voltage phases and RF current phases, relating to the embodiment of FIG. 10.

DETAILED DESCRIPTION

The embodiments of the invention described below relate to output networks for use with amplifiers with Chireix type outphasing behavior in a large part of an output power range, whereby the number of transistors in the amplifier is not equal to the power of two. That is, the output networks according to embodiments of the invention are for use with amplifiers with Chireix outphasing behavior comprising 3, 5, 6, 7, 9, 10, 11, 12, 13, 14, 15, 17, etc transistors or sources. The embodiments of the invention may also be used with other types of amplifier.

The embodiments of the invention provide high-efficiency asymmetric hierarchic Chireix amplifiers based on asymmetric output network structures, as will be described in further detail below. These output networks have hierarchic Chireix structure but, contrary to known structures, have different hierarchic depth in different parts of the same "level". These amplifiers generally have very good efficiency curves and close to parabolic output RF currents for all of the constituent transistors.

The output networks described in the embodiments of the invention below are for use with a multi-transistor amplifier circuit comprising N transistors configured to provide a Chireix outphasing behaviour, the N transistors coupled to receive different amplitude and/or phase signals relative to a source signal. In other words, the N transistors are coupled to receive an amplitude-dependent nonlinear function of the source signal, that is, a signal whose amplitude is a nonlinear function of the source signal amplitude and whose phase relative to that of the source signal is a nonlinear function of the source signal amplitude.

Figure 2A:
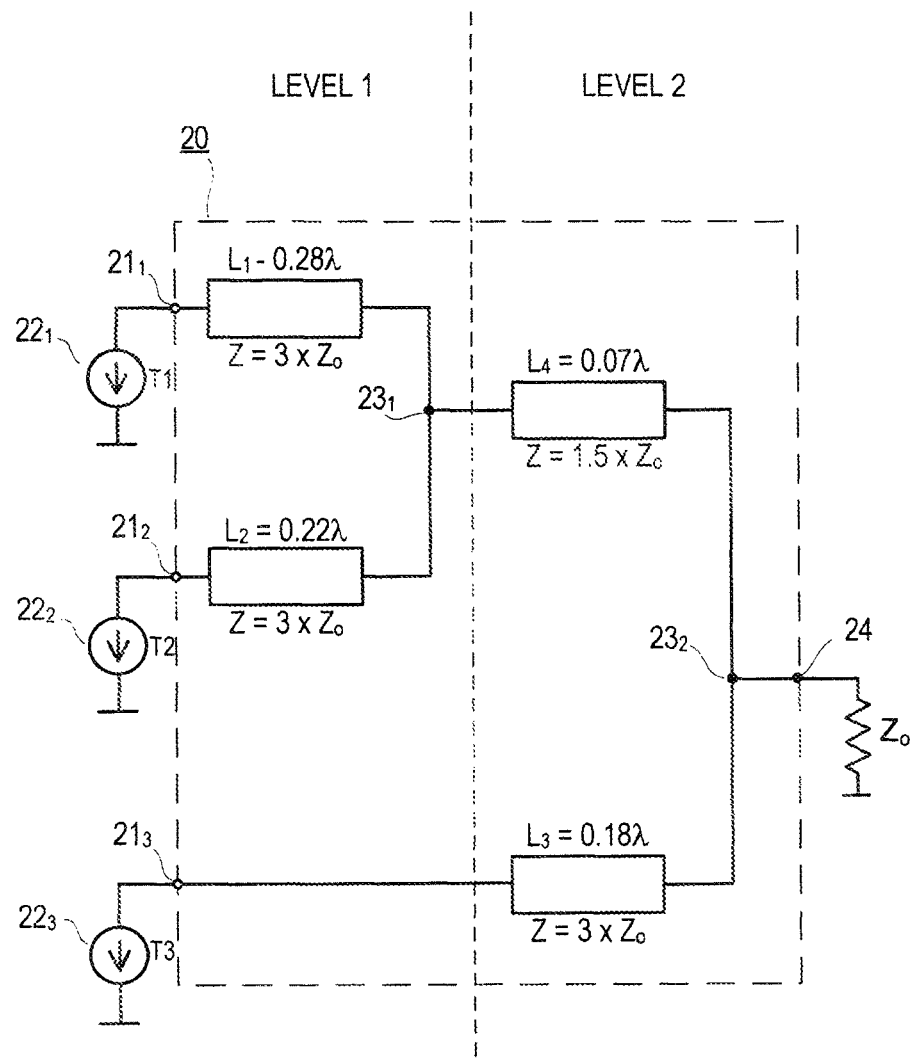
FIG. 2a shows an example of an embodiment of the present invention relating to a two-level output network for use with a three transistor Chireix amplifier.

FIG. 2a shows an embodiment of an output network according to a first embodiment of the present invention. The output network 20 is for use with a multi-transistor amplifier circuit comprising N transistors configured to provide a Chireix outphasing behaviour, the N transistors coupled to receive different amplitude and/or phase signals relative to a source signal. The example structure of FIG. 2a comprises a two-level architecture for use with three input signals, that is receiving input signals from three transistors or amplifiers $22_1$, $22_2$ and $22_3$.

The output network 20 comprises a plurality of branches that are configured or arranged in an hierarchical manner. A first branch comprises a first end coupled to a first input node $21_1$ and a second end connected to a first branch connection $23_1$. A second branch comprises a first end coupled to a second input node $21_2$ and a second end connected to the first branch connection $23_1$. A third branch comprises a first end coupled to a third input node $21_3$ and a second end connected to a second branch connection $23_2$. A fourth branch comprises a first end coupled to the first branch connection $23_1$ and a second end connected to the second branch connection $23_2$.

In general terms the output network 20 of FIG. 2a comprises a plurality of branches arranged in a hierarchical structure between N input nodes $21_1$ to $21_N$ and an output node 24, and at least one branch connection 23 arranged between the input nodes $21_1$ to $21_N$ and the output node 24. Each branch connection 23 is arranged to couple first and second branches from an input side to a single branch on an output side. The hierarchical structure is arranged asymmetrically such that at least one branch connection 23 (for example branch connection $23_2$ in the example of FIG. 2a) comprises a different number of input nodes ultimately connected to its first branch compared to the number of input nodes ultimately connected to its second branch. In the example of FIG. 2a branch connection $23_2$ comprises two input nodes ultimately connected to a first branch (i.e. input nodes $21_1$ and $21_2$) and one input node ultimately connected to a second branch (i.e. input node $21_3$).

Figure 1A:
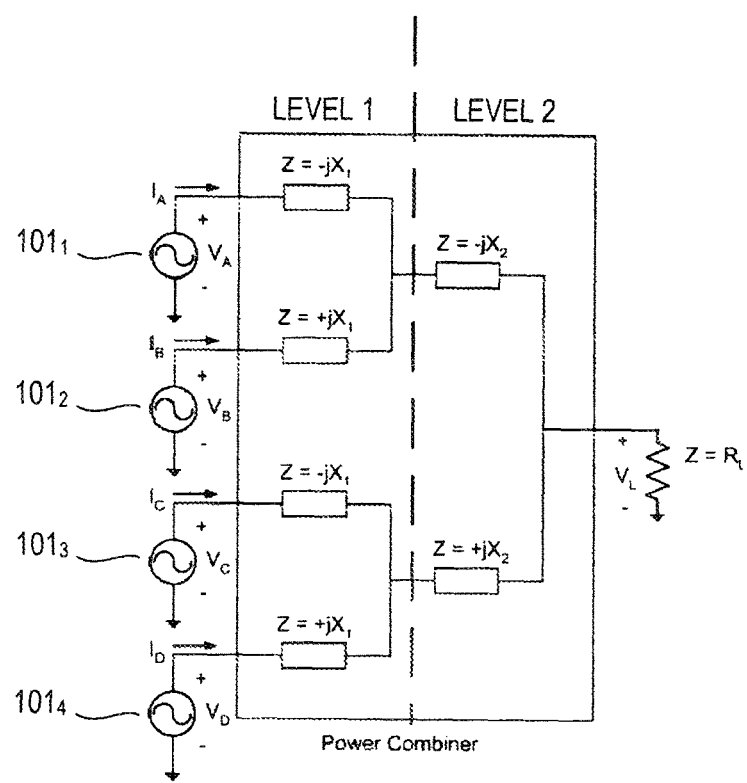
FIG. 1a shows an example of a two-level Chireix amplifier network according to the prior art.
Figure 1B:
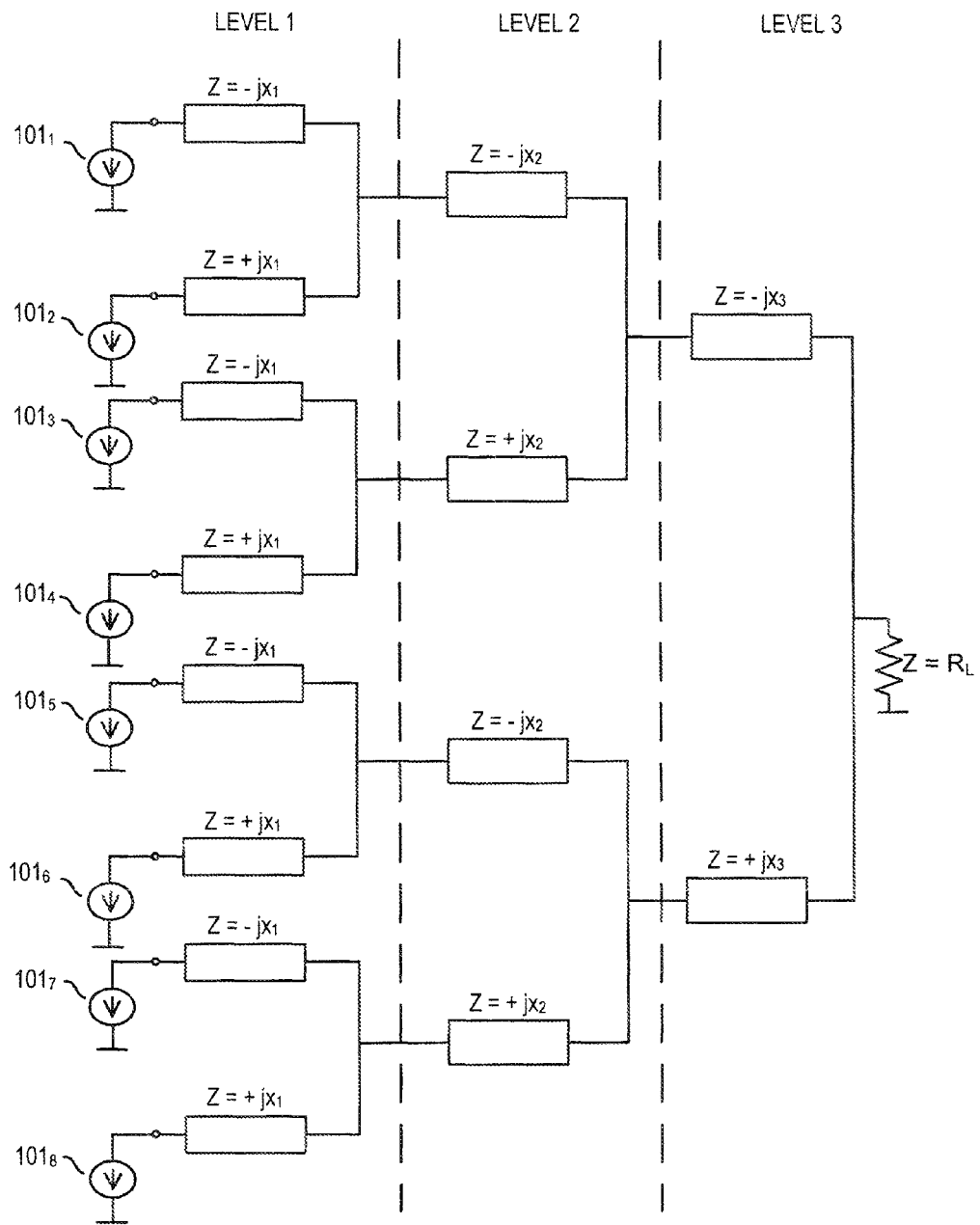
FIG. 1b shows an example of a three-level Chireix amplifier network according to the prior art.

According to one example, the transmission lines L1 and L2 of the first and second branches in the pair of braches connected to branch connection $23_1$ sum to 0.5 wavelengths (lambda), for example as provided in a Chireix pair. However, the transmission lines L4 and L3 of the third and fourth branches in the pair of branches connected to branch connection $23_2$ sum to 0.25 wavelengths, which is contrary to the next level in a 4-transistor structure, for example as described in FIG. 1. As such, the structure of FIG. 2a is not simply a "pruned" version of FIG. 1 in order to provide asymmetry, but preferably also comprises adjustments to the transmission lines of particular branches to provide a required effect (for example by changing the reactance of a transmission line to provide a desired cumulative wavelength for a pair of branches connected to a branch connection).

It is noted that each branch comprises a transmission line having a predetermined line length and characteristic impedance, or an equivalent circuit thereof, or a predetermined reactance comprising an inductance and/or capacitance or equivalent circuit thereof, or a combination of transmission line and reactance.

According to one example, a first branch and a second branch forming a pair of branches on the input side of a branch connection 23 that sees asymmetry towards the input side (for example branch connection $23_2$) comprise a combined electrical length of about 0.25 wavelengths (lambda). Also, a first branch and a second branch forming a pair of branches on the input side of a branch connection 23 that sees symmetry towards the input side (for example branch connection $23_1$) comprise a combined electrical length of about 0.5 wavelengths (lambda).

It can also be seen that the electrical length of a first branch in the pair of branches differs from the electrical length of a second branch in the pair of branches.

Various alternatives may be used to achieve the desired effect. For example, it is noted that, as mentioned above, each branch may comprise 1) a transmission line having a predetermined length and characteristic impedance, or 2) its equivalent circuit, or 3) a predetermined reactance (capacitance or inductance) or equivalent circuit or 4) a combination of transmission line(s) and reactance(s).

It is also noted that networks built with series reactances are generally not equivalent circuits of the networks built with transmission lines, although their behaviour with respect to amplitudes of currents and voltages (and therefore efficiency) are the same. Although the embodiments herein describe a symmetrical transmission line that forks with a combined electrical length of 0.5 wavelengths, a symmetric pair of branches consisting of an inductor and/or a capacitor of equal reactance magnitude may also be used. Similarly, an asymmetric pair of branches with a combined electrical length of 0.25 wavelengths may be replaced with an inductor and/or a capacitor having a set of reactances chosen appropriately to provide an equivalent function.

Figure 2B:
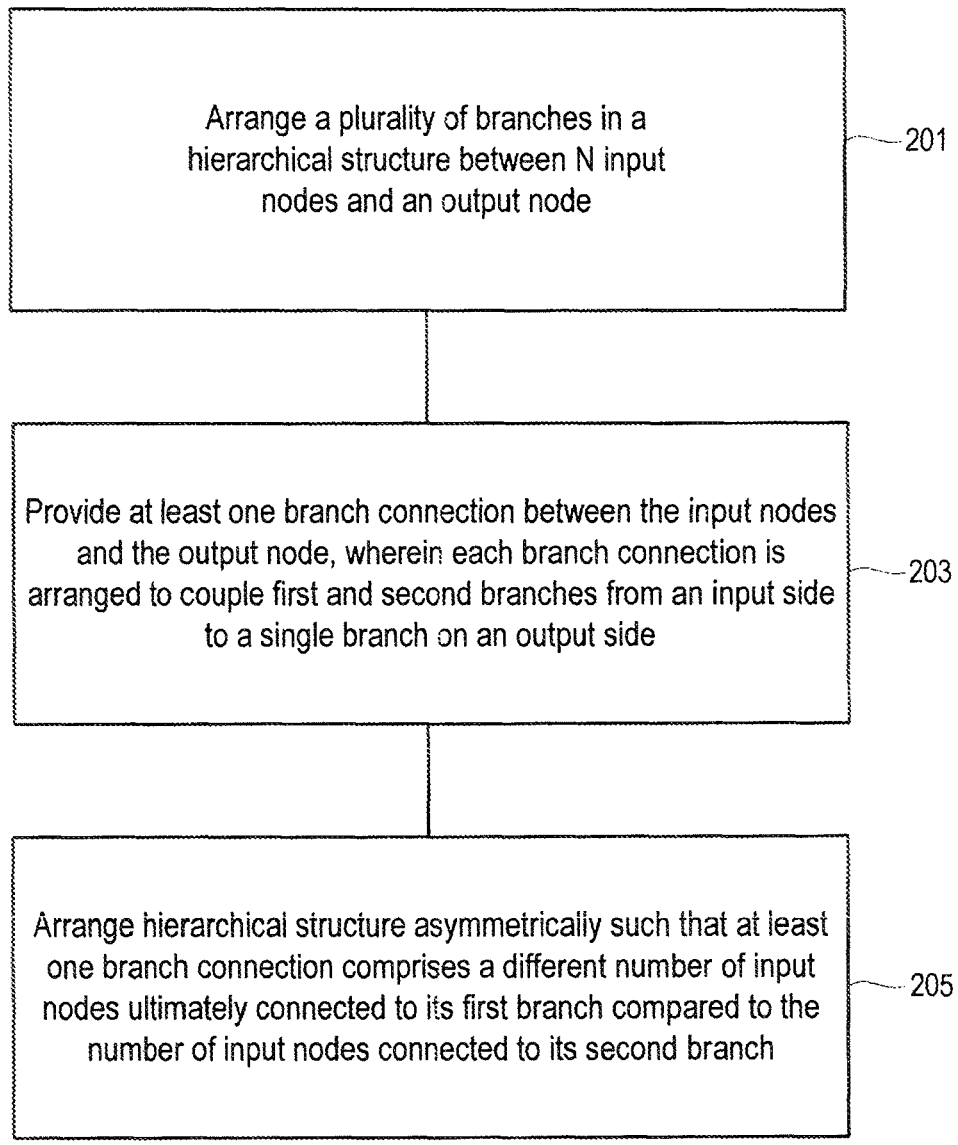
FIG. 2b shows a method according to an embodiment of the present invention.

FIG. 2b shows a method according to an embodiment of the present invention, for providing outphasing in an output network such as that shown in FIG. 2a, for use with a multi-transistor amplifier circuit comprising N transistors configured to provide a Chireix outphasing behaviour, wherein the N source transistors are coupled to receive different amplitude and/or phase signals relative to a source signal. The method comprises the steps of arranging a plurality of branches in a hierarchical structure between N input nodes and an output node, step 201.

At least one branch connection is provided between the input nodes and the output node, wherein each branch connection is arranged to couple first and second branches from an input side to a single branch on an output side, step 203.

The hierarchical structure is arranged asymmetrically such that at least one branch connection comprises a different number of input nodes ultimately connected to its first branch compared to the number of input nodes ultimately connected to its second branch.

The RF behavior of the currents and voltages in the embodiment of FIG. 2a are illustrated in FIGS. 3a to 3d.

Figure 3A:
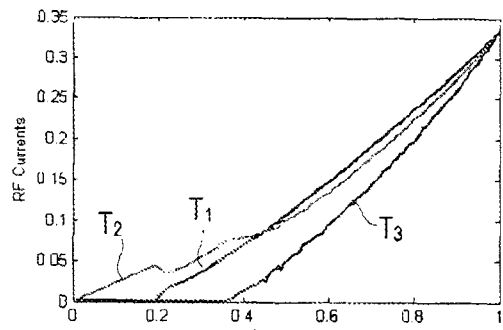

FIG. 3a shows a plot of RF currents versus amplitude, relating to the embodiment of FIG. 2a. RF current T2 is active (delivering RF current) from zero output amplitude. T1 is active from 0.2 of full amplitude, whereas T3 is active from 0.35 of full amplitude.

Figure 3B:
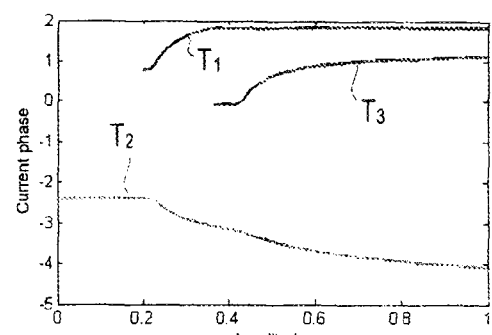

FIG. 3b shows a plot of current phases relative to the phase of the output signal, relating to the embodiment of FIG. 2a. T1, T3 and T2 are shown in order from top to bottom.

Figure 3C:
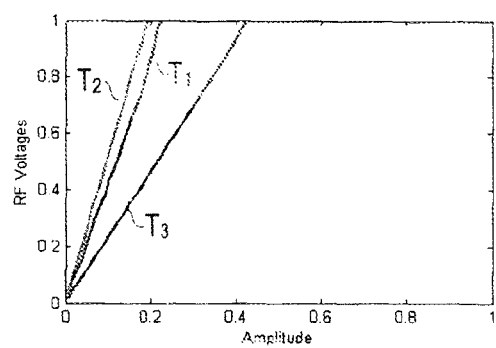

FIG. 3c shows a plot of RF voltages versus amplitude, relating to the embodiment of FIG. 2a. The voltage rise as a function of amplitude in the low amplitude range is highest for T2, lower for T1, and lowest for T3.

Figure 3D:
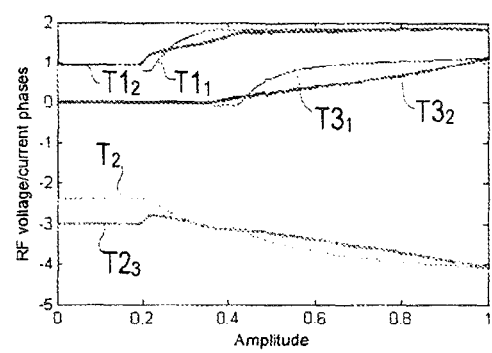

FIG. 3d shows a plot of RF voltage phases $T1_2$, $T3_2$ and $T2_2$ (from top to bottom) and RF current phases $T1_1$, $T3_1$ and $T2_1$ (from top to bottom), relating to the embodiment of FIG. 2a.

All three currents have "sub-linear" parabolic behavior, and the relative phases show "outphasing" behavior in the amplitude region above 0.2 of full output.

Figure 4:
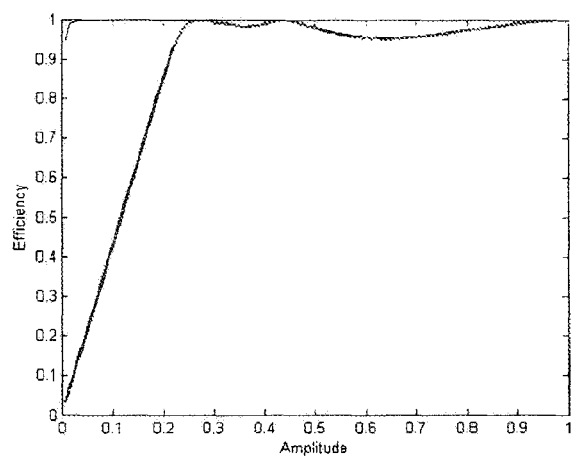
FIG. 4 illustrates the efficiency of a three-transistor asymmetric hierarchic Chireix amplifier according to one embodiment based on FIG. 2.

The efficiency curve of the amplifier (assuming otherwise perfect waveforms) is shown in FIG. 4.

Figure 5:
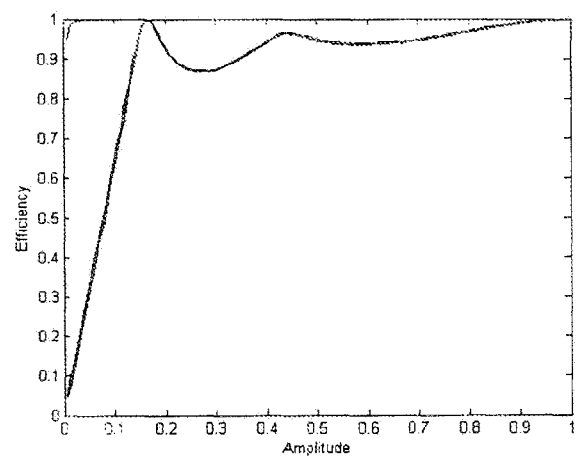

The placement of efficiency peaks is achieved primarily by choosing the electrical lengths in the network. By having a small electric length difference between the line lengths in the Chireix pair (0.22 and 0.28 wavelengths in the example), the first efficiency peak is placed at a low output amplitude. This is exemplified by changing the above circuit of FIG. 2a to have the lengths 0.23 and 0.27 wavelengths instead. The resulting efficiency curve is shown in FIG. 5.

Figure 6:
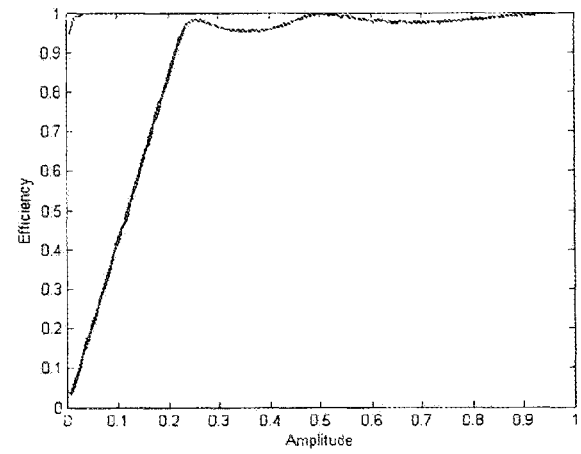

Changing the other line length relation causes mainly a change to the placement of the second efficiency peak. This is exemplified by changing the other pair of lines to 0.08 and 0.17 wavelengths (still summing to 0.25 wavelengths), which moves the second efficiency peak to a higher output amplitude, as seen in FIG. 6.

The electrical lengths (in wavelengths) of the two branches in a fork is generally chosen so that an efficiency maximum is placed at a certain amplitude; more similar lengths (such as 0.23 and 0.27) place the efficiency maximum at a lower amplitude point than more dissimilar lengths (such as 0.19 and 0.31) would. When using more than one pair, this can be coordinated between pairs.

Figure 7:
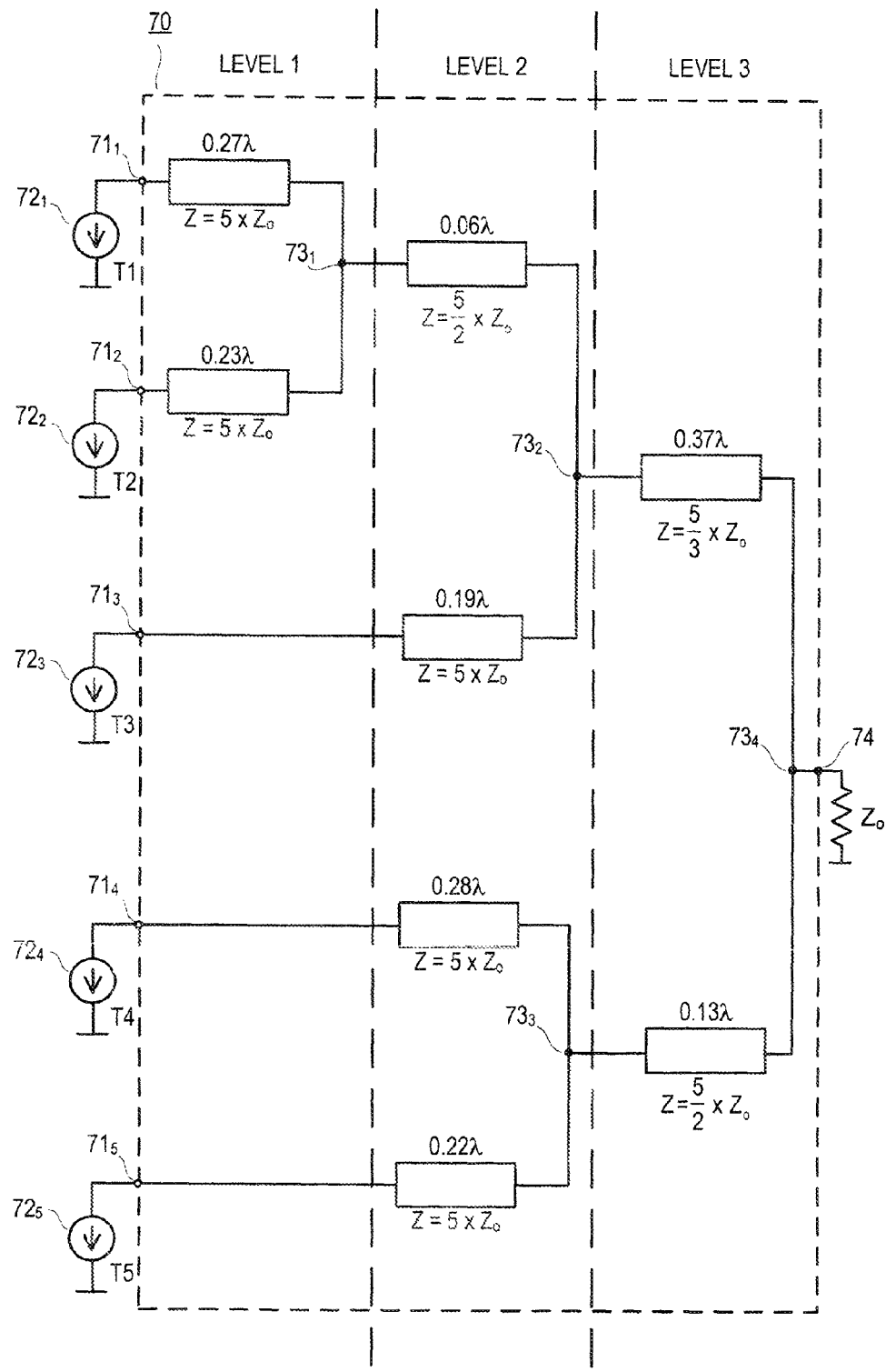
FIG. 7 shows an example of an embodiment of the present invention relating to a three-level output network for use with a five transistor Chireix amplifier.
Figure 10:
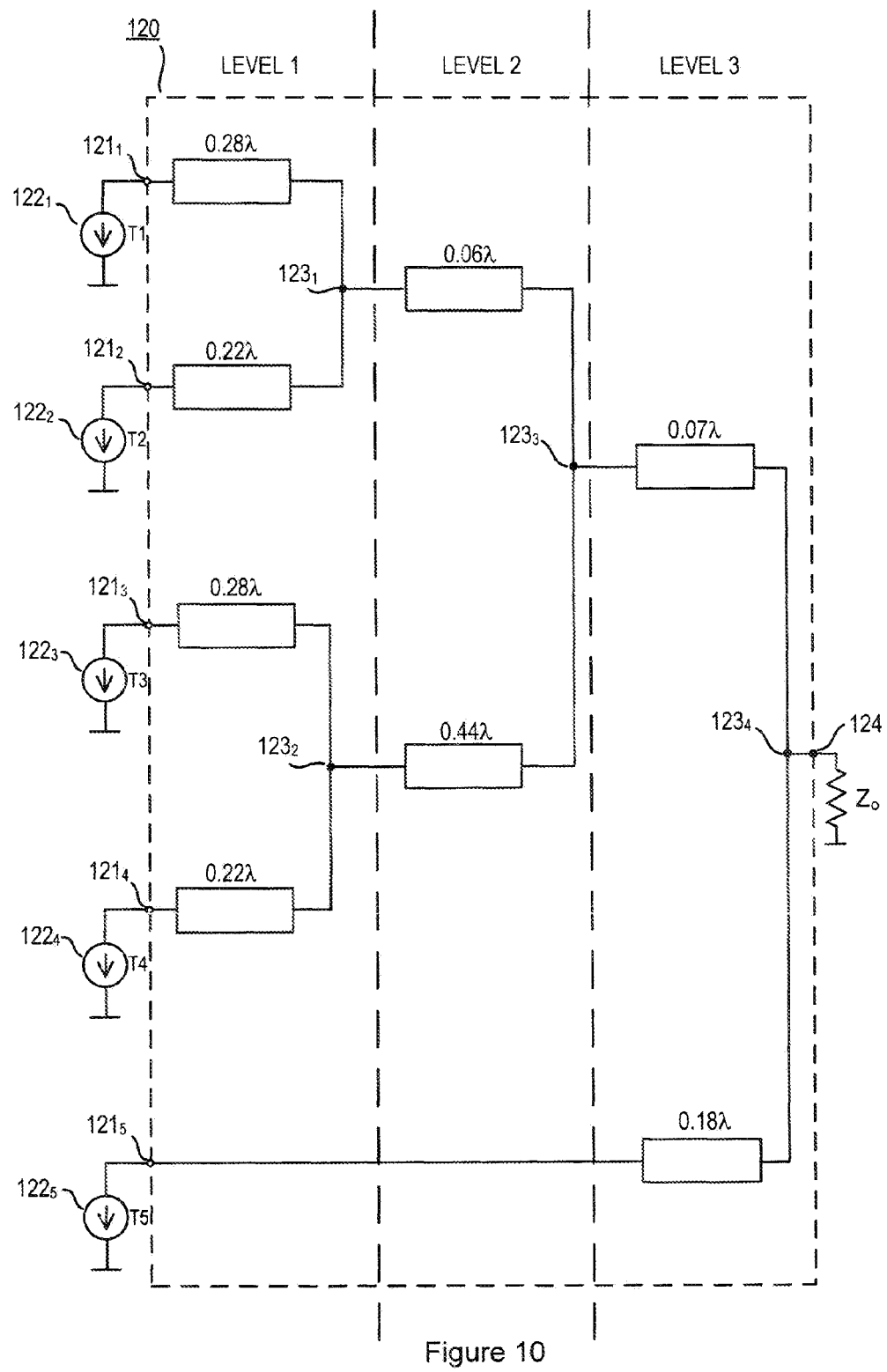
FIG. 10 shows an example of another embodiment of the present invention relating to a three-level output network for use with a five transistor Chireix amplifier.

FIGS. 7 and 10 described below illustrate embodiments of the invention for two different 5-transistor amplifier structures, whereby the asymmetry is placed at different levels.

FIG. 7 shows an embodiment in which the asymmetry is placed at the second level.

In the output network 70 of FIG. 7 a first branch comprises a first end coupled to a first input node $71_1$ and a second end connected to a first branch connection $73_1$. A second branch comprises a first end coupled to a second input node $71_2$ and a second end connected to the first branch connection $73_1$. A third branch comprises a first end coupled to a third input node $71_3$ and a second end connected to a second branch connection $73_2$. A fourth branch comprises a first end coupled to the first branch connection $73_1$ and a second end connected to the second branch connection $73_2$. A fifth branch comprises a first end coupled to a fourth input node $71_4$ and a second end connected to a third branch connection $73_3$. A sixth branch comprises a first end coupled to a fifth input node $71_5$ and a second end connected to the third branch connection $73_3$. A seventh branch comprises a first end coupled to the second branch connection $73_2$ and a second end connected to a fourth branch connection $73_4$. An eighth branch comprises a first end coupled to the third branch connection $73_3$ and a second end connected to the fourth branch connection $73_4$.

It can be seen from above that the structure in the upper part of the figure, with three transistors and combining network, is similar to the three-transistor amplifier previously described in FIG. 2a. As such, this part has asymmetry, whereby the output network 70 of FIG. 7 comprises a plurality of branches arranged in a hierarchical structure between N input nodes $71_1$ to $71_5$ and an output node 74, and at least one branch connection 73 arranged between the input nodes $71_1$ to $71_N$ and the output node 74. Each branch connection 73 is arranged to couple first and second branches from an input side to a single branch on an output side. The hierarchical structure is arranged asymmetrically such that at least one branch connection 73 (for example branch connection $73_2$ in the example of FIG. 7) comprises a different number of input nodes ultimately connected to its first branch compared to the number of input nodes ultimately connected to its second branch. As can be seen, one input branch coupled to branch connection $73_2$ ultimately comprises two input nodes $71_1$ and $71_2$ connected thereto, whereas a second input branch to branch connection $73_2$ ultimately comprises one input node $71_3$ connected thereto. Therefore, branch connection $73_2$ comprises a different number of input nodes ultimately connected to its first branch compared to the number of input nodes ultimately connected to its second branch.

This asymmetry can also be seen at branch connection $73_4$ in the example of FIG. 7, in which one input branch coupled to branch connection $73_4$ ultimately comprises three input nodes $71_1$, $71_2$ and $71_3$ connected thereto, whereas a second input branch to branch connection $73_4$ ultimately comprises two input nodes $71_4$ and $71_5$ connected thereto. Therefore, branch connection $73_4$ also comprises a different number of input nodes ultimately connected to its first branch compared to the number of input nodes ultimately connected to its second branch.

FIGS. 8a-8d are similar plots to those of FIGS. 3a to 3d, but for the embodiment of FIG. 7 rather than FIG. 2a. Therefore, FIG. 8a shows a plot of RF currents versus amplitude, relating to the embodiment of FIG. 7.

FIG. 8b shows a plot of current phases relative to the phase of the output signal, relating to the embodiment of FIG. 7.

FIG. 8c shows a plot of RF voltages versus amplitude, relating to the embodiment of FIG. 7.

FIG. 8d shows a plot of RF voltage phases and RF current phases, relating to the embodiment of FIG. 7.

The efficiency curve of the amplifier shown in FIG. 7 is illustrated in FIG. 9.

FIG. 10 shows another embodiment of an output network for use with a five-transistor amplifier, with the asymmetry at the top level (or third level).

The output network 120 comprises a plurality of branches configured as follows. A first branch comprises a first end coupled to a first input node $121_1$ and a second end connected to a first branch connection $123_1$. A second branch comprises a first end coupled to a second input node $121_2$ and a second end connected to the first branch connection $123_1$. A third branch comprises a first end coupled to a third input node $121_3$ and a second end connected to a second branch connection $123_2$. A fourth branch comprises a first end coupled to a fourth input node $121_4$ and a second end connected to the second branch connection $123_2$. A fifth branch comprises a first end coupled to the first branch connection $123_1$ and a second end connected to a third branch connection $123_3$. A sixth branch comprises a first end coupled to the second branch connection $123_2$ and a second end coupled to the third branch connection $123_3$. A seventh branch comprises a first end coupled to the third branch connection $123_3$ and a second end connected to a fourth branch connection $123_4$. An eighth branch comprises a first end coupled to a fifth input node $121_5$ and a second end connected to the fourth branch connection $123_4$.

From FIG. 10 it can be seen that the structure of this embodiment is different from the embodiment of FIG. 7, in that the single amplifier is connected directly to the branch connection $123_4$ connected to the output node 124 by a length of transmission line. This length and the length from the 4-transistor hierarchical Chireix structure add to 0.25 wavelengths (i.e. 0.18 plus 0.07 in the example), as was the case also with the three-transistor structure (both on its own and in the previous five-transistor amplifier).

As such, the hierarchical structure is arranged asymmetrically, whereby the output network 120 of FIG. 10 comprises a plurality of branches arranged in a hierarchical structure between N input nodes $121_1$ to $121_5$ and an output node 124, and at least one branch connection 123 arranged between the input nodes $121_1$ to $121_N$ and the output node 124. Each branch connection 123 is arranged to couple first and second branches from an input side to a single branch on an output side. The hierarchical structure is arranged asymmetrically such that at least one branch connection 123 (for example branch connection $123_4$ in the example of FIG. 10) comprises a different number of input nodes ultimately connected to its first branch compared to the number of input nodes ultimately connected to its second branch. As can be seen, one input branch coupled to branch connection $123_4$ ultimately comprises four input nodes $121_1$, $121_2$, $121_3$ and $121_4$ connected thereto, whereas a second input branch to branch connection $123_4$ ultimately comprises one input node $121_5$ connected thereto. Therefore, branch connection $123_4$ comprises a different number of input nodes ultimately connected to its first branch compared to the number of input nodes ultimately connected to its second branch.

The RF behaviour of currents and voltages is shown in FIGS. 11a to 11d.

FIG. 11a shows a plot of RF currents versus amplitude, relating to the embodiment of FIG. 10.

FIG. 11b shows a plot of current phases relative to the phase of the output signal, relating to the embodiment of FIG. 10.

FIG. 11c shows a plot of RF voltages versus amplitude, relating to the embodiment of FIG. 10.

FIG. 11d shows a plot of RF voltage phases and RF current phases, relating to the embodiment of FIG. 10.

It can be seen from the above that the embodiment of FIG. 10 is not as thoroughly optimized as that of the embodiment of FIG. 7.

It is noted that other embodiments not shown are also possible, for use with a different number of input signals from input transistors or amplifiers.

It is also noted that the transistor sizes need not be equal. There can be advantages of using different size transistors in different parts of the structures, both for optimizing the efficiency curve to suit certain output amplitude distributions and in the case that the total maximum output power does not allow a set of equally sized transistors. Therefore, in one embodiment, an output network is configured to receive input signals from a plurality of transistors, whereby one or more of the transistors has a different size to the other transistors.

In the embodiments described above the output networks have been described as being constructed with lengths of transmission line. It is noted that these can be replaced with networks built with equivalent circuits (for example LC pi networks, T networks, L networks, cascaded networks etc.), reactance networks, or other LC, transmission line or hybrid networks.

With the output networks provided by the embodiments of the invention, new amplifier structures for Chireix outphasing with close to parabolic RF currents on all transistors can be obtained with the number of transistors not being a power of two. Amplifiers with this beneficial behaviour, with 3, 5, 6, 7, 9, 10, 11, 12, 13, etc. numbers of transistors, are therefore made possible. Providing close to parabolic RF output currents has the advantage of minimizing series losses.

Amplifiers having output networks as described in the embodiments above are advantageous in situations where transistor series losses dominate and amplifiers with four or eight (etc. powers of two) differently driven transistors are not feasible due to complexity or size restrictions.

Figure 12:
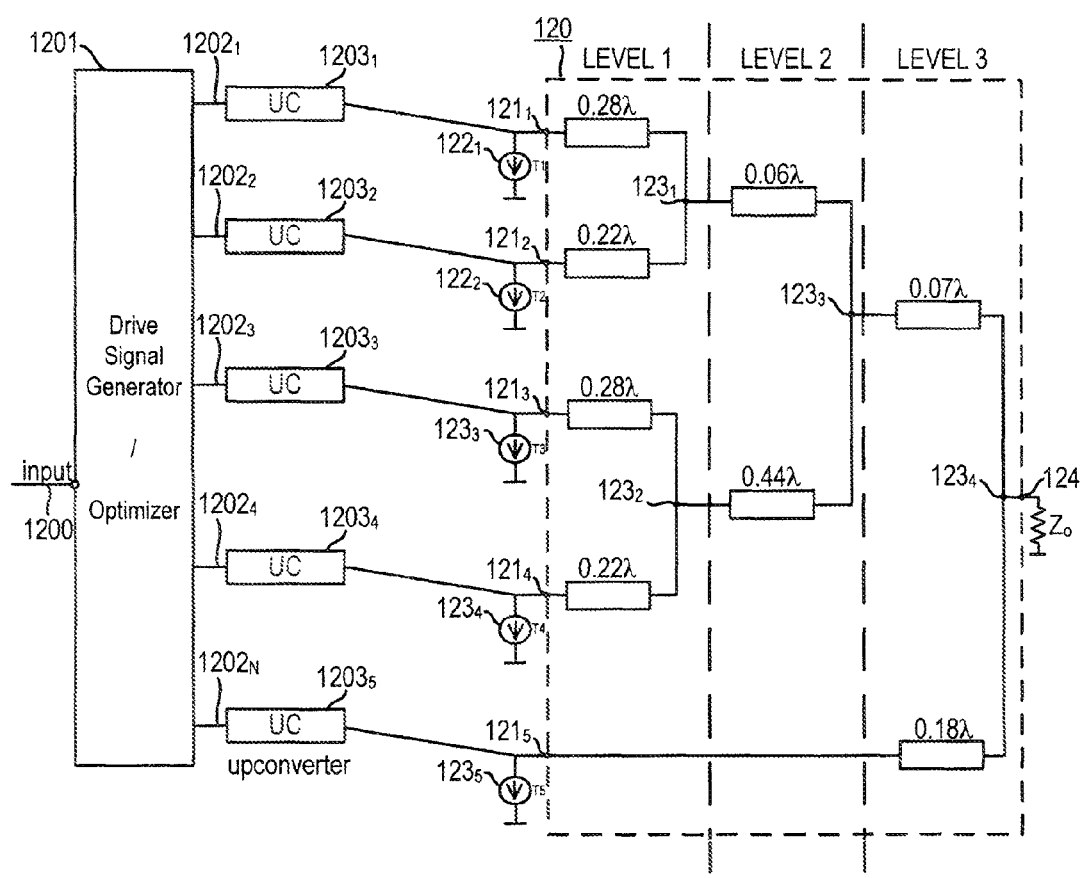
FIG. 12 shows a typical application of the various embodiments of the invention.

FIG. 12 shows a typical application of an embodiment of the invention. FIG. 12 is shown with a 3-level arrangement as described in FIG. 10, but it is noted that any of the embodiments may be used with such an application: An input signal 1200 is in digital baseband form. A Drive Signal Generator/Optimizer 1201 outputs several signals $1202_1$ to $1202_N$ (for example $1202_1$ to $1202_5$) with different amplitude and phase relative to the input signal 1200 (designed to give the correct RF output currents from the transistors as described in the previous Figures). Up-converters (UC) $1203_1$ to $1203_6$ contain digital-to-analogue converters, mixers, filters, or amplifiers etc., that convert and translate the signal to RF drive signals (voltages) at the input of the final power amplifier transistors $121_1$ to $121_5$. Coupled to the power amplifier transistors $121_1$ to $121_5$ is an output network as described in FIG. 10 above.

The embodiments of the invention have the advantage of providing less complex transistor amplifiers (for example three-transistor or five-transistor amplifiers) but with similar properties to power-of-two amplifiers having two or four transistors. In other words, the embodiments of the invention having 3, 5, 7 transistors, for example, have the advantage of being almost as efficient as 4, 8, 16 amplifiers, but with far less complexity. Generally there are diminishing efficiency returns for higher numbers of transistors, so the most efficient of these sizes are the three-transistor and five-transistor Chireix amplifiers.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfill the functions of several units recited in the claims. Any reference signs in the claims shall not be construed so as to limit their scope.

The invention claimed is:

1. An output network for use with a multi-transistor amplifier circuit comprising N transistors configured to provide a Chireix outphasing behaviour, the N transistors coupled to receive different amplitude and/or phase signals relative to a source signal, the output network comprising:
   a plurality of branches arranged in a hierarchical structure between N input nodes and an output node;
   at least one branch connection arranged between the input nodes and the output node, wherein each branch connection is arranged to couple first and second branches from an input side to a single branch on an output side;
   wherein the hierarchical structure is arranged asymmetrically such that at least one branch connection comprises a different number of input nodes ultimately connected to its first branch compared to the number of input nodes ultimately connected to its second branch.

2. An output network as claimed in claim 1, wherein the plurality of branches are configured such that:
   a first branch comprises a first end coupled to a first input node and a second end connected to a first branch connection;
   a second branch comprises a first end coupled to a second input node and a second end connected to the first branch connection;
   a third branch comprises a first end coupled to a third input node and a second end connected to a second branch connection; and
   a fourth branch comprises a first end coupled to the first branch connection and a second end connected to the second branch connection.

3. An output network as claimed in claim 1, wherein the plurality of branches are configured such that:
   a first branch comprises a first end coupled to a first input node and a second end connected to a first branch connection;
   a second branch comprises a first end coupled to a second input node and a second end connected to the first branch connection;
   a third branch comprises a first end coupled to a third input node and a second end connected to a second branch connection;
   a fourth branch comprises a first end coupled to the first branch connection and a second end connected to the second branch connection;
   a fifth branch comprises a first end coupled to a fourth input node and a second end connected to a third branch connection;
   a sixth branch comprises a first end coupled to a fifth input node and a second end connected to the third branch connection;
   a seventh branch comprises a first end coupled to the second branch connection and a second end connected to a fourth branch connection; and
   an eighth branch comprises a first end coupled to the third branch connection and a second end connected to the fourth branch connection.

4. An output network as claimed in claim 1, wherein the plurality of branches are configured such that:
   a first branch comprises a first end coupled to a first input node and a second end connected to a first branch connection;
   a second branch comprises a first end coupled to a second input node and a second end connected to the first branch connection;
   a third branch comprises a first end coupled to a third input node and a second end connected to a second branch connection;

a fourth branch comprises a first end coupled to a fourth input node and a second end connected to the second branch connection;

a fifth branch comprises a first end coupled to the first branch connection and a second end connected to a third branch connection;

a sixth branch comprise a first end coupled to the second branch connection and the third branch connection;

a seventh branch comprises a first end coupled to the third branch connection and a second end connected to the fourth branch connection; and an eighth branch comprises a first end coupled to a fifth input node and a second end connected to a fourth branch connection.

5. An output network as claimed in claim 1, wherein each branch comprises a transmission line having a predetermined line length and characteristic impedance, or an equivalent circuit thereof, or a predetermined reactance comprising an inductance and/or capacitance or equivalent circuit thereof, or a combination of transmission line and reactance.

6. An output network as claimed in claim 5 wherein, for a branch connection having an asymmetric connection towards the input side, a first transmission line and a second transmission line forming a pair of branches on the input side of the branch connection have a combined line length of about 0.25 wavelengths.

7. An output network as claimed in claim 5 wherein, for a branch connection having an symmetric connection towards the input side, a first transmission line and a second transmission line forming a pair of branches on the input side of the branch connection have a combined line length of about 0.5 wavelengths.

8. An output network as claimed in claim 6, wherein the line length of the first transmission line in the pair of branches differs from the line length of the second transmission line in the pair of branches.

9. An output network as claimed in claim 8, wherein:
a first transmission line comprises a line length of 0.07 wavelengths and the second transmission line comprises a line length of 0.18 wavelengths; or
a first transmission line comprises a line length of 0.06 wavelengths and the second transmission line comprises a line length of 0.19 wavelengths.

10. An output network as claimed in claim 8, wherein:
a first transmission line comprises a line length of 0.28 wavelengths and the second transmission line comprises a line length of 0.22 wavelengths; or
a first transmission line comprises a line length of 0.06 wavelengths and the second transmission line comprises a line length of 0.44 wavelengths; or
a first transmission line comprises a line length of 0.27 wavelengths and the second transmission line comprises a line length of 0.23 wavelengths; or
a first transmission line comprises a line length of 0.37 wavelengths and the second transmission line comprises a line length of 0.13 wavelengths.

11. An amplifier circuit comprising a plurality of transistors configured to provide a Chireix outphasing behaviour, wherein the plurality of transistors are coupled to respective input nodes of an output network as defined in claim 1.

12. An amplifier circuit as claimed in claim 11, wherein each of the transistors has the same size.

13. An amplifier circuit as claimed in claim 11, wherein one or more of the transistors has a different size to the other transistors.

14. A method of providing outphasing in an output network for use with a multi-transistor amplifier circuit comprising N transistors configured to provide a Chireix outphasing behaviour, the N source transistors coupled to receive different amplitude and/or phase signals relative to a source signal, the method comprising the steps of:

arranging a plurality of branches in a hierarchical structure between N input nodes and an output node;

providing at least one branch connection between the input nodes and the output node, wherein each branch connection is arranged to couple first and second branches from an input side to a single branch on an output side; and wherein the hierarchical structure is arranged asymmetrically such that at least one branch connection comprises a different number of input nodes ultimately connected to its first branch compared to the number of input nodes ultimately connected to its second branch.

* * * * *